United States Patent
Asayama et al.

(10) Patent No.: US 7,274,589 B2
(45) Date of Patent: Sep. 25, 2007

(54) SEMICONDUCTOR STORAGE DEVICE

(75) Inventors: Shinobu Asayama, Kawasaki (JP);
Toshio Komuro, Kawasaki (JP)

(73) Assignee: NEC Electronics Corporation,
Kanagawa (JP)

( * ) Notice: Subject to any disclaimer, the term of this patent is extended or adjusted under 35 U.S.C. 154(b) by 78 days.

(21) Appl. No.: 11/318,777

(22) Filed: Dec. 28, 2005

(65) Prior Publication Data

US 2006/0171193 A1   Aug. 3, 2006

(30) Foreign Application Priority Data

Jan. 28, 2005   (JP)   ............................. 2005-021126

(51) Int. Cl.
*G11C 11/00* (2006.01)
*G11C 8/00* (2006.01)

(52) U.S. Cl. .................................. 365/154; 365/230.05

(58) Field of Classification Search ................ 365/154, 365/230.05, 156
See application file for complete search history.

(56) References Cited

U.S. PATENT DOCUMENTS

| | | | | |
|---|---|---|---|---|
| 5,235,543 A | * | 8/1993 | Rosen | 365/154 |
| 5,260,908 A | * | 11/1993 | Ueno | 365/230.05 |
| 6,538,954 B2 | * | 3/2003 | Kunikiyo | 365/230.05 |
| 6,661,733 B1 | * | 12/2003 | Pan et al. | 365/230.05 |

FOREIGN PATENT DOCUMENTS

| | | |
|---|---|---|
| JP | 08-0007574 | 1/1996 |
| JP | 11-007776 | 1/1996 |
| JP | 10-027476 | 1/1998 |

* cited by examiner

*Primary Examiner*—Anh Phung
(74) *Attorney, Agent, or Firm*—Young & Thompson

(57) ABSTRACT

An SRAM cell 1 includes inverters 10, 20, N-type FETs 32, 34, 36, 38, word lines 42, 44, bit lines 46, 48, and voltage applying circuits 50, 60. The voltage applying circuits 50, 60 apply a voltage $V_{dd}$ to the word lines 42, 44 at the time of a read operation of the SRAM cell 1. The voltage applying circuits 50, 60 apply a voltage ($V_{dd}+\alpha$) to the word lines 42, 44 at the time of a write operation of the SRAM cell 1. Here, $\alpha>0$. Namely, the SRAM cell 1 is configured in such a manner that a voltage applied to word lines 42, 44 at the time of the write operation is higher than at the time of the read operation.

4 Claims, 3 Drawing Sheets

SEMICONDUCTOR STORAGE DEVICE

This application is based on Japanese patent application No. 2005-021126, the content of which is incorporated hereinto by reference.

BACKGROUND

1. Technical Field

The present invention relates to a semiconductor storage device.

2. Related Art

Semiconductor storage devices of the related art are disclosed, for example, in Japanese Laid-open Patent Publication NO's H 11-7776, H8-7574, and H10-27476. The semiconductor storage device disclosed in Japanese Laid-open Patent Publication NO. H11-7776 is equipped with an SRAM cell constructed from six transistors. Namely, in addition to four transistors constituting a latch circuit, the SRAM cell also has two pass transistors provided between the latch circuit and bit lines on either side.

With semiconductor storage devices configured in this manner, since a plurality of SRAM cells are controlled by a single word line, cells other than a target cell are selected when a certain word line is selected. This means that unnecessary pre-charging and discharging are carried out at the time of read and write operations because the cells other than the target cell discharge bit lines connected to the cells. This causes power consumption of the semiconductor storage device to increase.

With regards to this, semiconductor storage devices with pass transistors provided doubly are disclosed in Japanese Laid-open Patent Publication NO's H8-7574, and H10-27476. Here, two pass transistors are connected in series between a latch circuit and each bit line. With semiconductor storage devices of this configuration, it is possible to select only the target cell by controlling these two transistors using individual word lines and resulting increases in power consumption can therefore be suppressed.

SUMMARY OF THE INVENTION

By the way, in order to ensure a sufficient SRAM cell write margin, it has been necessary to carry out design in such a manner that the power (current-drive power) of the pass transistors is superior to that of the load transistors, namely, the P-type FETs (Field Effect Transistors) constituting the latch circuit. However, with the SRAM cells of Japanese Laid-open Patent Publication NO's H8-7574 and H10-27476, pass transistors are provided doubly in SRAM cells of the related art, which causes overall power of the pass transistors to fall and also causes an accompanying decrease in the write margin. In recent years, this problem with the write margin has become extremely important, as requirements for lowering of power supply voltages are getting stronger.

According to the present invention, there is provided a semiconductor storage device comprising an SRAM cell having a first inverter, a second inverter with an input terminal and output terminal connected to an output terminal and input terminal of said first inverter respectively, a first pass transistor provided in a path between said output terminal of said first inverter and a first bit line, a second pass transistor provided in a path between said output terminal of said second inverter and a second bit line, and a word line connected to gates of said first and second pass transistors, wherein said SRAM cell comprising: a third pass transistor provided in a path between said first pass transistor and said first bit line; a fourth pass transistor provided in a path between said second pass transistor and said second bit line; and a voltage applying unit applying a first voltage to said word line at the time of a read operation of said SRAM cell, and applying a second voltage larger than said first voltage to said word line at the time of a write operation of said SRAM cell.

With this semiconductor storage device, a voltage applying unit applying a larger voltage to the word line at the time of a write operation than at the time of a read operation is provided in the SRAM cell. As a result, since it is possible to apply a high voltage to the gates of the pass transistors at the time of writing, a sufficient write margin can be ensured.

According to the present invention, it is possible to implement a semiconductor storage device capable of ensuring a sufficient write margin and capable of achieving low power consumption.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The following is a detailed description with reference to the drawings of a preferred embodiment of a semiconductor storage device of the present invention. In the description of the drawings, the same elements are given the same numerals and duplicated descriptions will not be given.

FIRST EMBODIMENT

Figure 1:
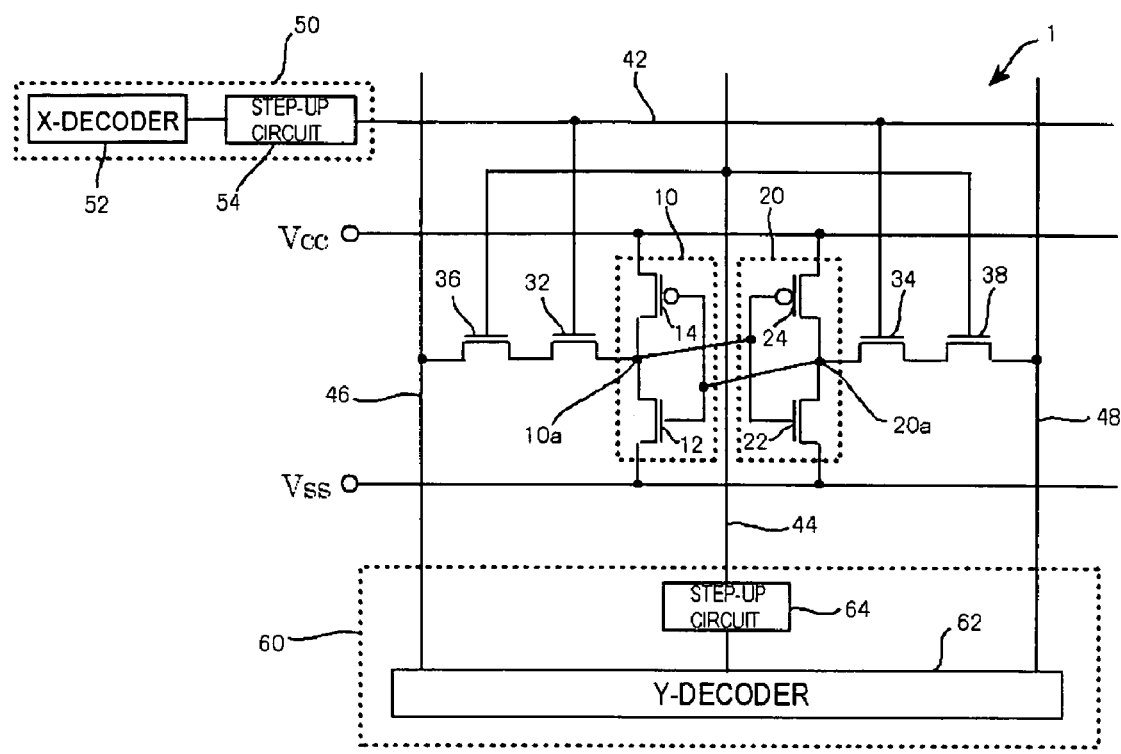
FIG. 1 is a circuit structure view illustrating an SRAM cell provided in a semiconductor storage device of the first embodiment of the present invention.

FIG. 1 is a circuit structure view illustrating an SRAM cell provided in a semiconductor storage device of the first embodiment of the present invention. The semiconductor storage device of this embodiment is an SRAM (Static Random Access Memory) and includes a plurality of SRAM cells 1 shown in the drawing.

The SRAM cell 1 includes inverters 10, 20, N-type FETs (Field Effect Transistors) 32, 34, 36, 38, word lines 42, 44, bit lines 46, 48, and voltage applying circuits 50, 60. The inverters 10, 20 mutually intersect and are coupled, and constitute a latch circuit. Namely, the output terminal 10a of the inverter 10 (first inverter) and the input terminal of the inverter 20 (second inverter) are connected, and the input terminal of the inverter 10 and the output terminal 20a of the inverter 20 are connected.

The inverter 10 is composed of an N-type FET 12 (first drive transistor) and a P-type FET 14 (first load transistor).

Similarly, the inverter 20 is composed of an N-type FET 22 (second drive transistor) and a P-type FET 24 (second load transistor). The FETs 12, 22 function as drive transistors and the FETs 14, 24 function as load transistors. Power supply voltage $V_{ss}$ is applied to the sources of the FETs 12, 22. On the other hand, power supply voltage $V_{cc}$ is applied to the sources of the FETs 14, 24, where $V_{ss}<V_{cc}$. Here, the value of $V_{ss}$ can be set, for example, to 0V (earth potential) and the value of $V_{cc}$ can be set, for example, to 1.0V.

The FET 32 (first pass transistor) is then provided in a path between the output terminal 10a of the inverter 10 and the bit line 46 (first bit line). Further, the FET 36 (third pass transistor) is provided in a path between the FET 32 and the bit line 46. Specifically, the drains of the FETs 12, 14 and the drain of the FET 32 are connected, and the source of the FET 32 and the drain of the FET 36 are connected. Further, the source of the FET 36 is connected to the bit line 46. These FET 32 and FET 36 function as pass transistors.

Similarly, the FET 34 (second pass transistor) is provided in a path between the output terminal 20a of the inverter 20 and the bit line 48 (second bit line). Moreover, the FET 38 (fourth pass transistor) is provided in a path between the FET 34 and the bit line 48. Specifically, the drains of the FETs 22, 24 and the drain of the FET 34 are connected, and the source of the FET 34 and the drain of the FET 38 are connected. Further, the source of the FET 38 is connected to the bit line 48. These FET 34 and FET 38 also function as pass transistors.

The gates of the FETs 32, 34 are connected to the word line 42 (first word line). On the other hand, the gates of FETs 36, 38 are connected to the word line 44 (second word line). The voltage applying circuits 50, 60 are connected to the word lines 42, 44, respectively. The voltage applying circuit 50 (first voltage applying unit) includes a decoder 52 and a step-up circuit 54 and is a voltage applying unit applying a predetermined voltage to the word line 42. Similarly, the voltage applying circuit 60 (second voltage applying unit) includes a decoder 62 and a step-up circuit 64 and is a voltage applying unit applying a predetermined voltage to the word line 44.

The voltage applying circuits 50, 60 apply a voltage $V_{dd}$ (first voltage) to the word lines 42, 44, respectively, at the time of a read operation of the SRAM cell 1. On the other hand, the voltage applying circuits 50, 60 apply a voltage ($V_{dd}+\alpha$) (second voltage) to the word lines 42, 44, respectively, at a time of a write operation of the SRAM cell 1, where $\alpha>0$. Namely, the SRAM cell 1 is configured in such a manner that a voltage applied to word lines 42, 44 at the time of the write operation is higher than at the time of the read operation.

Specifically, each decoder 52, 62 outputs the voltage $V_{dd}$. The step-up circuit 54 outputs the voltage ($V_{dd}+\alpha$) by stepping up the voltage $V_{dd}$ outputted by the decoder 52 by a at the time of the write operation. Similarly, the step-up circuit 64 outputs the voltage ($V_{dd}+\alpha$) by stepping up the voltage $V_{dd}$ outputted by the decoder 62 by a at the time of the write operation. Here, $V_{dd}$ may be set to, for example, 1.0V, and a may be set to, for example, 0.2V.

Figure 2:
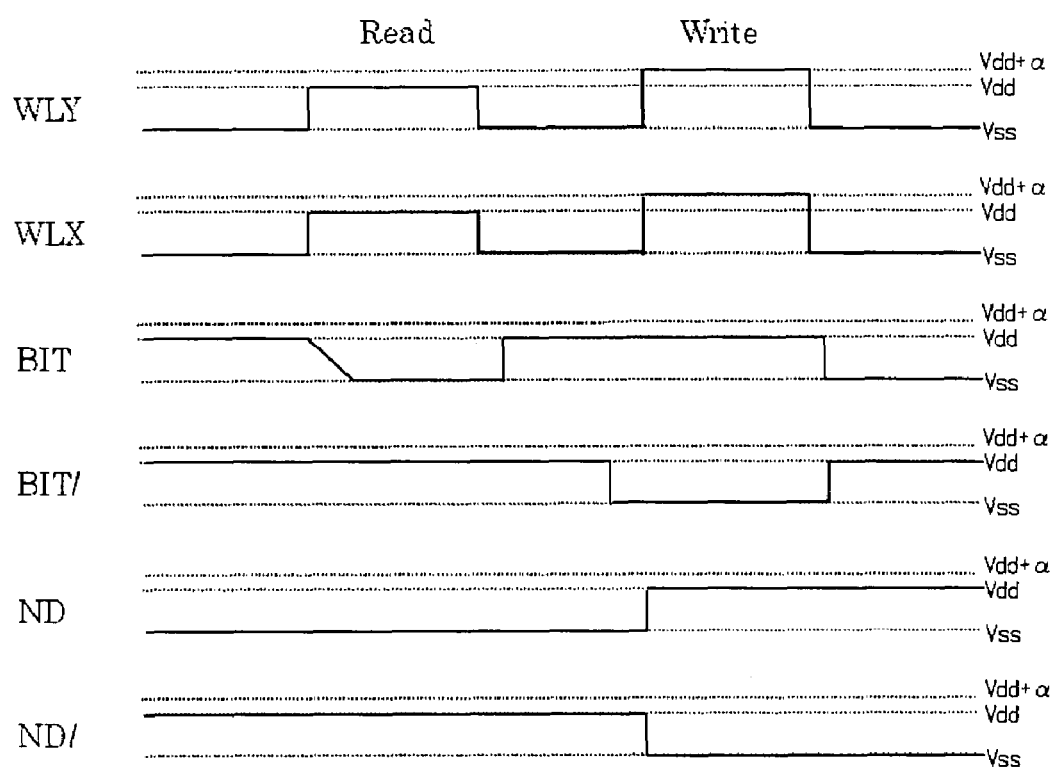
FIG. 2 is a timing chart illustrating the operation of the SRAM cell of FIG. 1.

A description of the operation of the SRAM cell 1 will now be given with reference to FIG. 2. In the drawing, WLY, WLX, BIT and BIT/indicate the potential of the word line 44, the word line 42, the bit line 46 and the bit line 48, respectively. Further, ND and ND/indicate the potential of the output terminal 10a and the output terminal 20a, respectively.

First, a description is given of the read operation. In this example, as shown in the drawing, the potential of the output terminal 10a is taken to be low ($V_{ss}$), and the potential of the output terminal 20a is taken to be high ($V_{cc}$). Further, the bit lines 46, 48 are taken to be in a pre-charged high state. In this state, the FETs 32, 34, 36, 38 are put on by putting the potentials of the word lines 42, 44 high using the voltage applying circuits 50, 60. In doing so, the bit line 46 is discharged. As a result, it is possible to read out data stored in the latch circuit.

Next, a description is given of the write operation. In this example, it is taken that data is written in such a manner that the potential of the output terminal 10a becomes high and the potential of the output terminal 20a becomes low. First, one (bit line 46) of the pre-charged bit lines 46, 48 is held high, and the other (bit line 48) is put low. In this state, the potentials of the word lines 42, 44 are put high using the voltage applying circuits 50, 60. At this time, a voltage ($V_{dd}+\alpha$) that is higher than $V_{dd}$ by $\alpha$ is applied to the word lines 42, 44. As a result, the FETs 32, 34, 36, 38 are put on, and the output terminal 10a and the output terminal 20a are put to high and low, respectively. Data can therefore be written to the latch circuit.

Continuing on, a description is now given of the effects of this embodiment. The voltage applying circuits 50, 60 applying a larger voltage to the word lines 42, 44 at the time of the write operation than at the time of the read operation are provided in the SRAM cell 1. As a result, it is possible to apply a high voltage to the gates of the FETs 32, 34, 36, 38 and increase the power of the FETs 32, 34, 36, 38 at the time of writing. This means that it is possible to ensure a sufficient write margin.

Further, the word lines 42, 44 are pre-charged or discharged only when both of the word lines 42, 44 are selected because the FET 32, 34 and the FET 36, 38 are controlled by the separate word lines 42, 44. It is therefore possible to achieve low power consumption with the semiconductor storage device of this embodiment because unnecessary pre-charging and discharging can be prevented. Further, as described above, because the configuration is such that the voltage applied at the time of writing is higher than the voltage applied at the time of reading, it is possible to ensure a sufficient write margin and the voltage $V_{dd}$ can be made a low voltage. Because of this it is possible to implement a semiconductor storage device particularly suited to low power consumption.

By the way, in Japanese Laid-open Patent Publication NO. H 11-7776, an SRAM provided with a step-up circuit is disclosed. This step-up circuit steps up a voltage applied to word lines at the time of the read operation. Namely, high-speed and low power consumption of the SRAM are achieved by driving at low voltage at the time of writing and when in standby and stepping up the voltage only at the time of the read operation. The operating speed of the SRAM cell is decided by the cell current flowing at the time of the read operation, and in most cases is decided by the power of the pass transistor. Because of this, a construction is adopted where the power of the pass transistor is increased only at the time of reading.

However, with a configuration such as for the SRAM cell 1 where pass transistors are provided doubly, as described previously, the write margin becomes small compared with the configuration where single pass transistors are provided. Even if the step-up circuit disclosed in Japanese Laid-open Patent Publication NO. H11-7776 is provided in the SRAM cell 1, this step-up circuit steps up the voltage at the time of reading and therefore does not contribute to improving the write margin. However, in this case, there is the fear of read failure occurring. With regards to this, the step-up circuits

54, 64 step up the voltage applied to the word lines 42, 44 at the time of writing and are therefore capable of improving the write margin of the SRAM cell 1.

The voltage applying circuit 50 is composed of the decoder 52 outputting the voltage $V_{dd}$, and the step-up circuit 54 outputting the voltage ($V_{dd}+\alpha$) at the time of the write operation by stepping up the voltage $V_{dd}$ outputted by the decoder 52. It is therefore possible for the voltage applying circuit 50 to be implemented with a simple configuration. Similarly, the voltage applying circuit 60 is also composed of the decoder 62 and the step-up circuit 64 and may also be implemented using a straightforward configuration.

Further, as described above, the FETs 32, 34 and the FETs 36, 38 are controlled by the separate word lines 42, 44 and it is therefore possible to select just the cell that is the target of reading or writing. As a result, with the semiconductor storage device of this embodiment, it is possible for the current flowing due to discharge to be kept small. As a result, the influence of IR drop when active becomes small, therefore reinforcement of the power supply and ground is no longer necessary and the degree of design freedom for upper layers increases. For example, it is possible for the layout for an SRAM cell to be concluded with just three metal layers. In this case, there is freedom in designing the fourth layer onwards and manufacturing costs can be reduced.

SECOND EMBODIMENT

Figure 3:
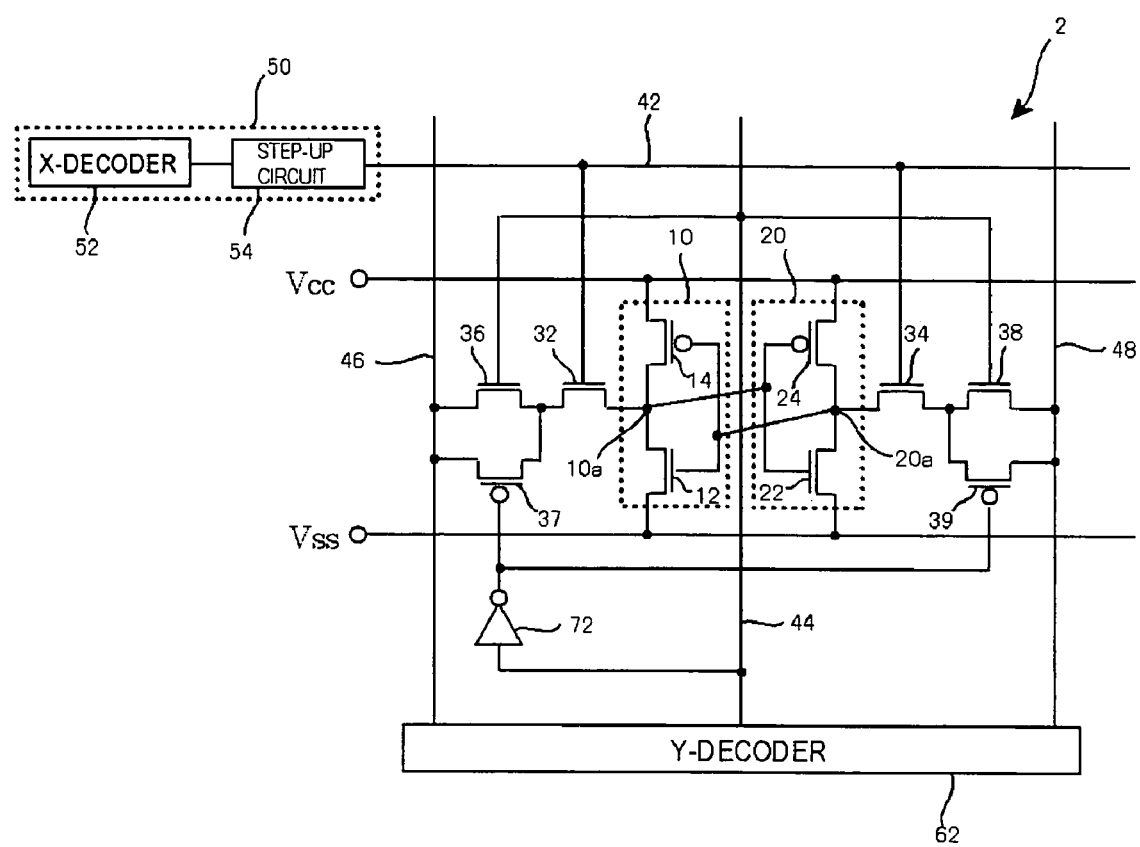
FIG. 3 is a circuit structure view illustrating an SRAM cell provided in a semiconductor storage device of the second embodiment of the present invention.

FIG. 3 is a circuit structure view illustrating an SRAM cell provided in a semiconductor storage device of the second embodiment of the present invention. The semiconductor storage device of this embodiment is an SRAM and includes a plurality of SRAM cells 2 shown in the drawing. The SRAM cell 2 includes the inverters 10, 20, the N-type FETs 32, 34, 36, 38, the word lines 42, 44, the bit lines 46, 48, and the voltage applying circuit 50. The configuration of each of these elements is the same as for that shown in FIG. 1.

Further, SRAM cell 2 includes P-type FETs 37, 39 and an inverter 72. The FET 37 (fifth pass transistor) is connected in parallel with the FET 36 and constitutes a CMOS switch together with the FET 36. Specifically, the source and drain of the FET 37 are connected to the source and drain of the FET 36, respectively. Further, the gate of the FET 37 is connected to the word line 44 via the inverter 72.

Similarly, the FET 39 (sixth pass transistor) is connected in parallel with the FET 38 and constitutes a CMOS switch together with the FET 38. Specifically, the source and drain of the FET 39 are connected to the source and drain of the FET 38, respectively. Further, the gate of the FET 39 is connected to the word line 44 via the inverter 72.

In this embodiment, a difference from the SRAM cell 1 of FIG. 1 is that the step-up circuit 64 is not provided. Namely, the word line 44 is connected directly to the decoder 62. As a result, a configuration where the voltage $V_{dd}$ is applied to the word line 44 at the time of the read operation or the time of the write operation is adopted.

Continuing on, a description is now given of the effects of this embodiment. The voltage applying circuit 50 is provided in the SRAM cell 2. As a result, it is possible to apply a high voltage to the gates of the FETs 32, 34 at the time of writing and it is possible to increase the power of FETs 32, 34. Further, the FETs 36, 37 that are of mutually opposite conductive types are connected together in parallel. The overall power of the FET 36, 37 is higher than the individual power of the FET 36. The same is true for the FETs 38, 39. As a result, it is possible to ensure a sufficient write margin without stepping up the voltage applied to the word line 44 at the time of writing. It is therefore possible to ensure a sufficient write margin even with a configuration where only the voltage applied to one of the two word lines 42, 44 is stepped up at the time of writing in the SRAM cell 2.

By only stepping up the voltage applied to one of the word lines 42, 44, it is possible to reduce power consumption still further compared to the case where the voltage applied to both is stepped up.

In this embodiment, a configuration is shown where the FETs 37, 39 are connected in parallel to the FETs 36, 38, respectively, but it is also possible for the FETs 37, 39 to be connected in parallel to the FETs 32, 34, respectively. Namely, the drain and source of the the FET 37 may be connected to the source and drain of the FET 32, respectively, and the source and drain of the FET 39 may be connected to the source and drain of the FET 34, respectively. In this case, the gates of the FETs 37, 39 are connected to the word line 42 via an inverter. Further, the step-up circuit 64 (refer to FIG. 1) is provided in place of the step-up circuit 54. It is apparent that the present invention is not limited to the above embodiment and may be modified and changed without departing from the scope and spirit of the invention.

What is claimed is:

1. A semiconductor storage device comprising an SRAM cell having a first inverter, a second inverter with an input terminal and output terminal connected to an output terminal and input terminal of said first inverter respectively, a first pass transistor provided in a path between said output terminal of said first inverter and a first bit line, a second pass transistor provided in a path between said output terminal of said second inverter and a second bit line, and a word line connected to gates of said first and second pass transistors;

wherein said SRAM cell comprising:

a third pass transistor provided in a path between said first pass transistor and said first bit line;

a fourth pass transistor provided in a path between said second pass transistor and said second bit line; and a voltage applying unit applying a first voltage to said word line at the time of a read operation of said SRAM cell, and applying a second voltage larger than said first voltage to said word line at the time of a write operation of said SRAM cell.

2. The semiconductor storage device according to claim 1, wherein said voltage applying unit comprises a decoder outputting said first voltage, and a step-up circuit outputting said second voltage at the time of said write operation by stepping up said first voltage outputted by said decoder.

3. The semiconductor storage device according to claim 1, said SRAM cell further comprising:

a fifth pass transistor, of an opposite conductive type to said first pass transistor, connected in parallel with said first pass transistor; and a sixth pass transistor, of an opposite conductive type to said second pass transistor, connected in parallel with said second pass transistor.

4. The semiconductor storage device according to claim 1, said SRAM cell further comprising:

a fifth pass transistor, of an opposite conductive type to said third pass transistor, connected in parallel with said third pass transistor; and a sixth pass transistor, of an opposite conductive type to said fourth pass transistor, connected in parallel with said fourth pass transistor.

* * * * *